United States Patent [19]

Twerdochlib et al.

[11] Patent Number: 5,416,430
[45] Date of Patent: May 16, 1995

[54] APPARATUS AND METHOD FOR IDENTIFICATION AND LOCATION OF INTERNAL ARCING IN DYNAMOELECTRIC MACHINES

[75] Inventors: Michael Twerdochlib, Oviedo; Robert L. Osborne, Winter Springs, both of Fla.

[73] Assignee: Electric Power Research Institute, Inc., Palo Alto, Calif.

[21] Appl. No.: 54,572

[22] Filed: Apr. 28, 1993

[51] Int. Cl.⁶ ..................... G01R 31/34; G01R 31/12
[52] U.S. Cl. ..................................... 324/772; 324/536
[58] Field of Search ............... 324/158 MG, 536, 545, 324/772; 340/648; 361/23, 24, 25, 26, 27

[56] References Cited

U.S. PATENT DOCUMENTS

| | | | |
|---|---|---|---|
| 363,129 | 5/1887 | Easton | 324/158 MG |
| 1,580,810 | 4/1926 | Burnham | 324/158 MG |
| 1,947,078 | 2/1934 | Cobb | 361/27 |
| 4,115,828 | 9/1978 | Rowe et al. | 361/1 |
| 4,156,846 | 5/1979 | Harrold et al. | 324/158 MG |
| 4,224,652 | 9/1980 | Fiorentzis | 361/42 |
| 4,338,504 | 7/1982 | Gray | 219/69 M |
| 4,446,426 | 5/1984 | Emery et al. | 324/158 MG |
| 4,641,080 | 2/1987 | Glennon et al. | 322/49 |
| 4,771,355 | 9/1988 | Emery et al. | 361/33 |
| 4,814,699 | 3/1989 | Koziel et al. | 324/158 MG |
| 4,853,818 | 8/1989 | Emery et al. | 361/33 |
| 4,940,933 | 7/1990 | Jenkins | 324/158 MG |
| 4,965,513 | 10/1990 | Haynes et al. | 324/158 MG |
| 5,126,677 | 6/1992 | Campbell et al. | 324/511 |

Primary Examiner—Ernest F. Karlsen
Attorney, Agent, or Firm—James W. Maccoun

[57] ABSTRACT

The present invention monitors RF emissions within a turbine generator. A coupling device provides a connection between preexisting thermal sensor leads and an RF monitor. Preexisting thermal sensor leads are connected to thermocouples and resistance temperature detectors during manufacture of the turbine generator. The RF monitor is used in the present invention to monitor RF emissions flowing in the thermal sensor leads thereby avoiding a need to retrofit RF sensors on the generator. The present invention also provides a capacitive coupling means between the thermal sensor leads and the RF monitor. The present invention also provides an inductive means to reduce interference from RF emissions having sources external to the generator.

18 Claims, 9 Drawing Sheets

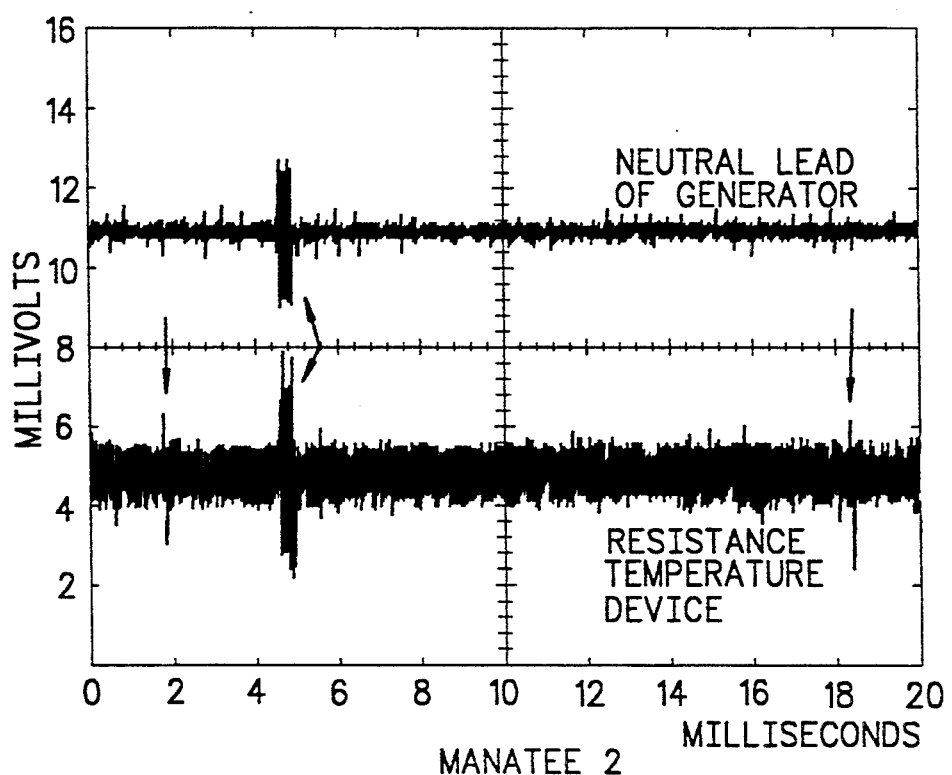
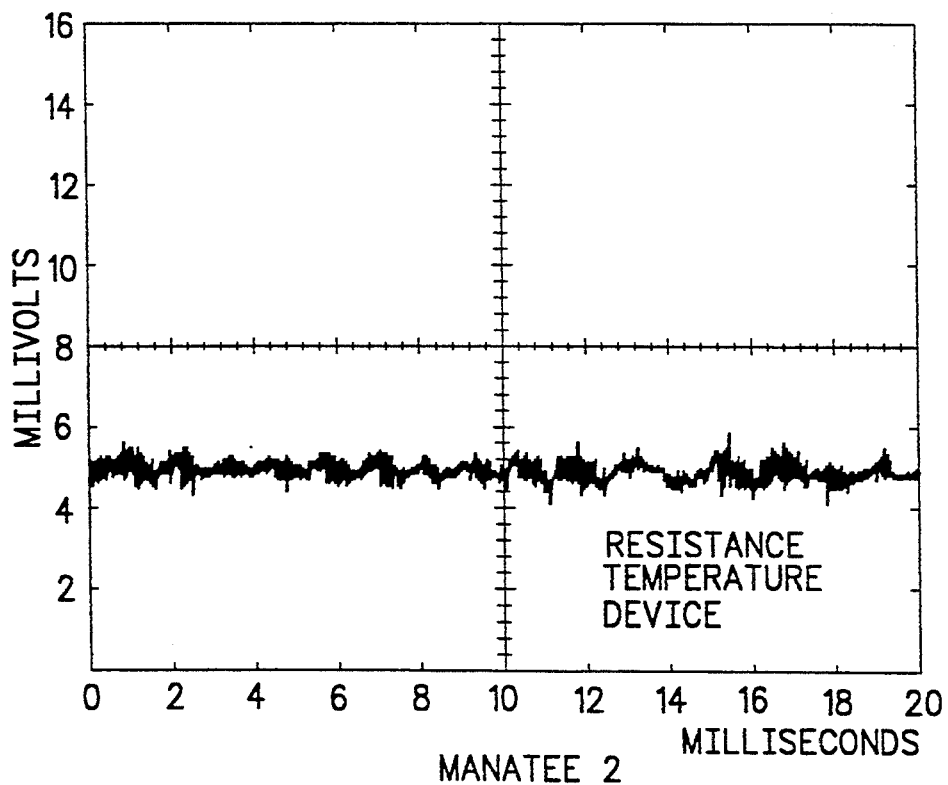

MANATEE 2

MONTICELLO

APPARATUS AND METHOD FOR IDENTIFICATION AND LOCATION OF INTERNAL ARCING IN DYNAMOELECTRIC MACHINES

BACKGROUND OF THE INVENTION

1. Field of Invention

The present invention relates to monitoring radio frequency (RF) emissions within dynamoelectric machines, such as turbine generators, to detect arcing and to provide early warnings of impending failure. More particularly, the present invention uses preexisting sensor leads from thermal sensors as communications media for monitoring RF emissions flowing from the interior to the exterior of a generator by way of such sensor leads. The thermal sensors whose sensor leads are monitored are thermocouples and resistance temperature detectors.

2. Description of the Related Art

Turbine generators are used by electric power utilities to supply electric power to the power distribution grid. These generators are very expensive items of equipment for electric power utilities to purchase and maintain. These generators are costly to repair due to their complexity, large sizes, heavy and bulky components, and due to difficulty in accessing their internal components. In addition, during times when generators are off-line for repair, the utility must purchase from other sources costly replacement electric power. For these reasons, utilities have recognized the importance of early detection of events which may signal impending generator failure. When such an event is identified, the generator is repaired before serious damage and long-term loss of generator service occurs.

Failures in stator windings are a major cause of generator failure. Stator winding failures and other types of generator failures are often preceded by localized arcing across conductors that have broken or have overheated and melted. In addition, arcing is also produced by failed electrical joints or insulation and reduced clearances between components at different potentials. Arcing is recognized as an early warning indicator that severe generator damage may result if corrective measures are not taken.

Generator arcing is also known to generate RF emissions. It is known to those skilled in the art to use RF monitors to monitor arcing activity and to use RF emission data as a basis for decisions on generator repair. FIG. 1 schematically illustrates a generator 10 having three phases 12, a neutral ground lead 14, and a grounding transformer 16. The neutral ground lead 14 is connected to ground by grounding transformer 16. Existing RF monitoring systems use an RF monitor 20, and a coupling device to connect RF monitor 20 to neutral ground lead 14. For example, a high frequency current transformer 22 is disposed with its core around the neutral ground lead 14. Current transformer 22 is used to couple RF currents flowing within the neutral ground lead 14 to RF monitor 20 which is a sensitive RF meter having built in alarm logic and set points. RF monitor 20 is commercially available and model 835A782C-01 sold by the Westinghouse Electric Company is an example of a suitable RF monitor. When a preselected abnormal change in RF activity occurs, such as a step change in RF emission activity, visual and audible alarm signals are activated and maintenance personnel are notified of the abnormal condition.

RF monitors for turbine generators are discussed in detail in U.S. Pat. No. 5,126,677, issued Jun. 30, 1992, entitled "Apparatus and Method for Preventing Spurious Signals to the RF Monitor Used for Early Warning of Impending Failure in Electric Generators and Other Equipment." This patent has a common assignee with the present invention and is hereby incorporated by reference. This patent taught the relationship between source-to-sensor distance and RF signal strength. This patent taught the use of two or more RF sensors and a method of comparing signals received from the two RF emission sensors.

Another example of an issued patent relating to RF monitors is U.S. Pat. No. 5,126,677, issued Aug. 1, 1989, entitled "System and Method for Detecting Arcing in Dynamoelectric Machines." This patent also has a common assignee with the present invention and is hereby incorporated by reference. This patent uses a capacitive voltage coupler attached to the neutral ground lead 14 to provide a connection between RF monitor 20 and neutral ground lead 14.

Unfortunately, the neutral ground lead 14 detects external RF emissions flowing through the ground system. These external emissions originate from most, if not all, of the equipment in the plant. Thus, RF monitoring systems connected to the neutral ground lead 14 suffer from interference from external sources.

The capability of identifying the location of origin of RF emissions is a valuable tool for generator maintenance because such capability can provide maintenance personnel with information which permits more accurate problem diagnosis and faster generator repair. Unfortunately, however, the neutral ground lead 14 receives RF emissions from all sources throughout the interior of generator 10. Thus, RF monitors relying only upon the generator's neutral ground lead 14 are not adapted to identify the particular location within a generator 10 of an RF emission.

A system which uses a plurality of retrofitted RF sensors on generator 10 and the RF source-to-sensor distance relationship mentioned above partially addresses the location identification needs of RF monitoring systems. However, there remains a need for an apparatus and method which requires minimal retrofitting to accomplish the objectives of locating RF emissions at various locations within generator 10. There also remains a need for a convenient apparatus and method which isolates internal RF emissions from RF emissions external to generator 10.

The present invention provides an apparatus and method for RF monitoring which reduces interference from RF sources that are external to generator 10. In addition, the present invention provides an apparatus and method which is a convenient means to indicate locations within generator 10 of the sources of RF emissions. Accordingly, the present invention provides a valuable contribution to generator maintenance.

Prior to providing a detailed description of the present invention, it is appropriate to describe in further detail the components of turbine generators. FIG. 2 schematically illustrates the components of turbine generators that are relevant to the present invention.

Generator 10 has stator 32 which has a tubular shaped aperture adapted to receive rotor 34. Rotor 34, having a tubular shape, extends longitudinally within generator 10 and is surrounded by stator 34. Three phase power leads 12 conduct electric power from generator 10. Neutral ground lead 14 provides a connection to ground for safety purposes.

FIG. 2 identifies two sections at opposite ends of generator 10. These sections are taken along the lines 3—3 and 3a—3a. FIG. 3 is a section view taken along either of the 3—3 or 3a—3a section lines shown in FIG. 2. The views along the 3—3 section line and the 3a—3a section line are essentially the same due to a symmetrical construction of generator 10. Accordingly, FIG. 3 is used to illustrate both sections. In FIG. 3, twelve thermal sensors 36 are shown to be distributed at various locations about stator 32. While twelve thermal sensors 36 are illustrated in the particular geometry of FIG. 3, this illustration is intended to be representative only. Different numbers and configurations of thermal sensors 36 are found among various models of generators 10. Thermal sensor 36 has sensor lead 38 to conduct temperature signals to temperature monitoring equipment (not shown). While only three sensor leads are shown for convenience, each thermal sensor 36 has a sensor lead 38 for a total of twelve sensor leads 38.

Thermal sensors 36 are not typically attached to or installed into stator 32 due to the 20 KVAC maximum voltage on the stator winding. In a gas cooled stator 32, thermal sensors 36 are located near the ending of stator winding bars where they sample the hot gas temperature of the hydrogen passing through the vents built within each bar. In water cooled stators 32, the exit water temperature is measured in the same manner. For a water cooled stator 32 one sensor per bar is required for a total of between thirty-six to seventy-two sensors. However, only twelve thermal sensors 36 are required in a gas cooled stator 32 because of "y" groups in the windings.

Abnormally high temperatures within generator 10 are an indicator of damage or impending damage to generator 10. Thermal sensors 36 allow continuous monitoring of temperature changes within generator 10. Thermal sensors 36 are thermocouples and/or resistance temperature detectors. Thermal sensors 36 are direct current devices, operating in the range of from 0 to 100 degrees C. Now returning to FIG. 2, sensor leads 38 are illustrated leading from both ends of generator 10. While FIG. 2 illustrates a total of six leads (rather than the actual twelve of generator 10), this reduced number of six should be understood to have been chosen to facilitate illustration.

The present inventors have found that useful RF emissions flow on sensor leads 38. It appears that such RF emissions flow on sensor leads 38 for the same reasons that RF emissions flow on the neutral ground lead 14. While sensor leads 38 carry direct current voltages in the range of a few milliamperes, RF emissions are alternating current voltages superimposed upon the direct current voltages.

The present inventors have taken advantage of their finding of RF emissions on sensor leads 38 to provide a novel apparatus and method for monitoring RF emissions. This novel apparatus and method uses preexisting sensor leads 38, either along with or without using the neutral ground lead 14, for monitoring RF emissions within generator 10. Use of sensor leads 38 provides information for locating the source of RF emissions within generator 10. In addition, use of the sensor leads 38 for RF monitoring facilitates reduction of interference from RF emissions originating from outside generator 10. It should be noted that neutral ground lead 14 is directly grounded to the power plant's ground grid and therefore many RF emissions from other systems within the plant are back fed to neutral ground lead 14. Moreover, thermal sensors 36 are preexisting so using sensor leads 38 permits the electric utility to avoid retrofit costs of installing RF sensors within generator 10.

SUMMARY OF THE INVENTION WITH OBJECTS

It is a general object of this invention to provide an improved apparatus and method for providing an early warning of arcing and impending generator damage and of impending generator failure.

It is an object of this invention to provide an improved apparatus and method which permits identification of generator problems before such problems cause serious damage to generators.

It is an object of this invention to provide an improved apparatus and method for detecting the existence and location of damage to generators.

It is another object of the invention to provide an improved apparatus and method which uses preexisting leads originating from within generators in order to monitor RF emissions thereby avoiding a need to retrofit RF sensors within generators.

It is another object of the invention to provide an improved apparatus and method for RF monitoring which is subject to reduced interference caused by RF emissions originating from the exterior of generators.

These and other objects are accomplished with a novel apparatus and method for identification and location of internal arcing in dynamoelectric machines. This novel apparatus and method uses preexisting sensor leads, either along with or without using the neutral ground lead, for monitoring RF emissions within a generator. Use of sensor leads provides information for locating the source of RF emissions within generator since the strength of RF emissions is greatest in those sensor leads which are closest to the source of RF emissions. In addition, use of the sensor leads for RF monitoring facilitates reduction of interference from RF emissions originating from outside the generator. Moreover, since thermal sensors are preexisting, using sensor leads permits the electric utility to avoid retrofit costs of installing RF sensors within the generator.

The present invention has an RF monitor and coupling devices which provide connections between sensor leads and the RF monitor. The RF monitor is used to monitor sensor leads to measure RF emissions flowing in sensor leads. A coupling device may be used to provide a connection between the generator's neutral ground lead and RF monitor. The RF monitor has a plurality of input channels to permit simultaneous monitoring of a plurality of coupling devices thereby allowing time coincident comparison of RF emissions monitored on different sensor leads and on the neutral ground lead.

When the RF monitor detects an RF emission of interest flowing on sensor leads maintenance personnel use the present invention to select one or more individual sensor leads which is likely to be close to the source of an RF emission. Proximity of a thermal sensor to a source of an RF emission is indicated by the strength of RF emissions flowing within its associated sensor lead.

After maintenance personnel have selected sensor leads to be of interest they use focus their attention on locations in the generator near thermal sensors that have been selected to be of interest.

The present inventors have tested the concept of the present invention in two turbine generators. These tests have found that there is a wide distribution of RF emissions observed on various sensor leads. Some sensor leads show no RF emissions at a given time while other sensor leads show considerable RF emission activity at that same time.

While the apparatus and method is disclosed with respect to generators, it should be understood to be equally applicable to other types of dynamoelectric machines.

BRIEF DESCRIPTION OF THE DRAWINGS

FIG. 3 is a block diagram of the generator of FIG. 2 taken along the section lines 3—3 to show locations of thermal sensors within a typical generator. This diagram is equivalent to a diagram of the generator taken along section lines 3a—3a.

FIG. 6 also illustrates an inductive system of the present invention which is used to reduce interference by external RF emissions.

FIG. 7 is a graphical representation of tested RF activity on the neutral lead of a working generator as well as a representation of time coincident RF activity on a resistance temperature detector sensor lead of the same generator.

FIG. 8 is a graphical representation of RF activity on a resistance temperature detector sensor lead of a working generator.

DESCRIPTION OF THE INVENTION

Figure 1:
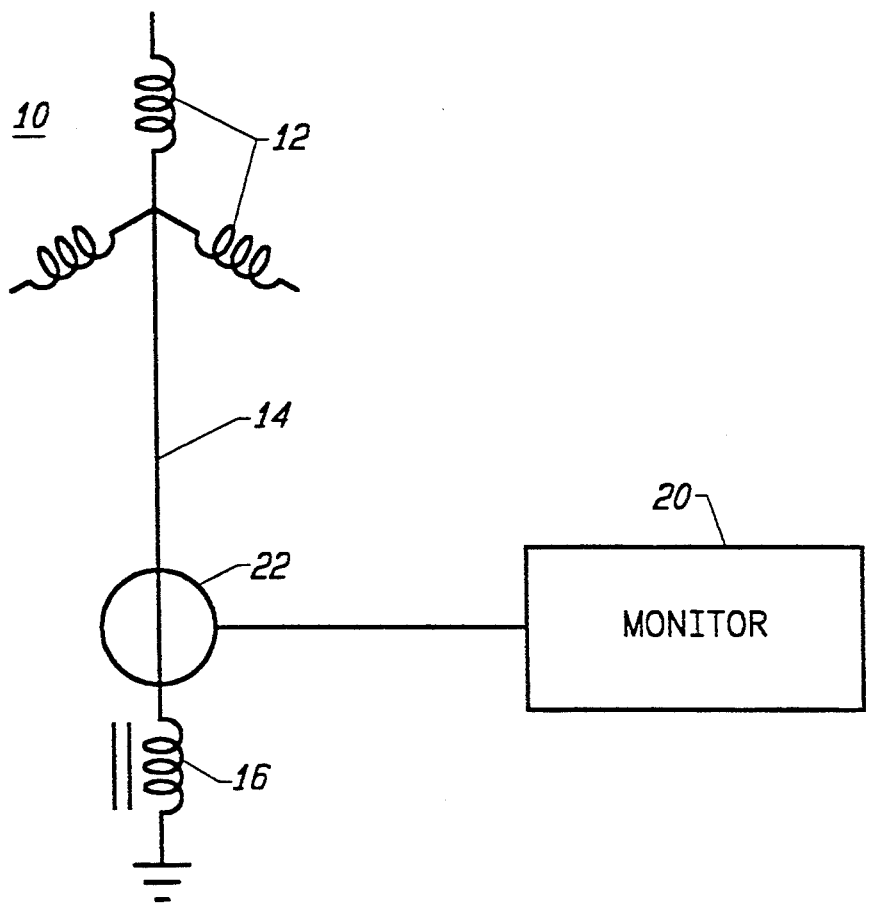
FIG. 1 is a block diagram of a three phase generator circuit with a prior art RF monitor connected to the neutral ground lead of the generator.
Figure 2:
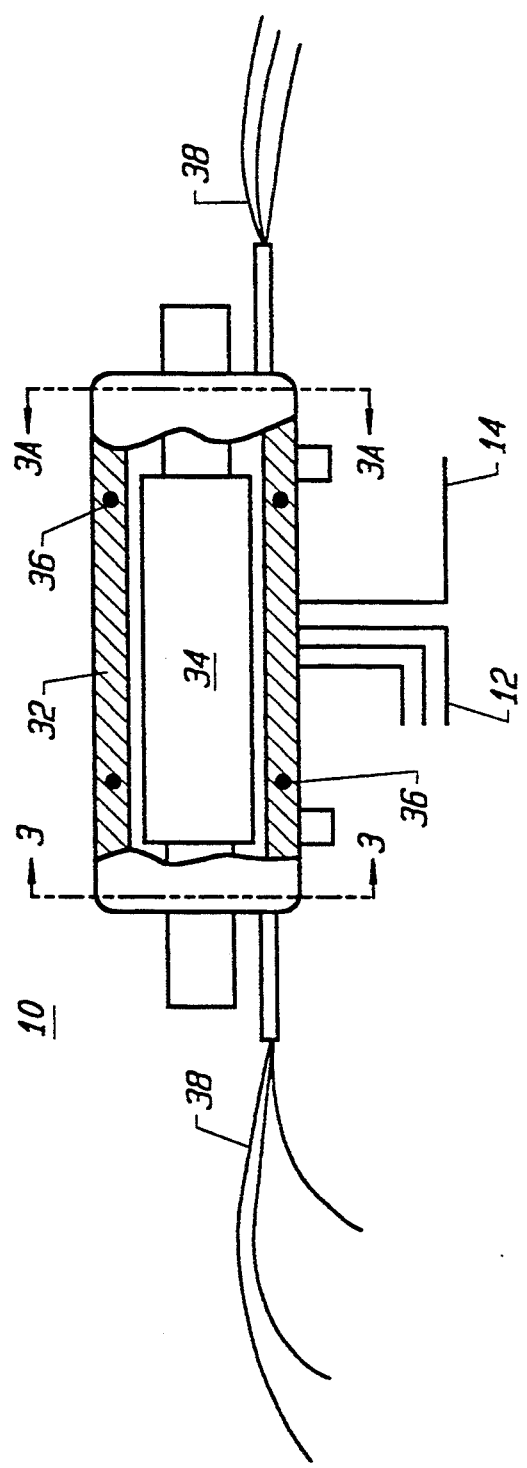
FIG. 2 is a block diagram showing construction of a typical generator, in partial section, to assist in understanding the environment in which the present invention is used.
Figure 3:
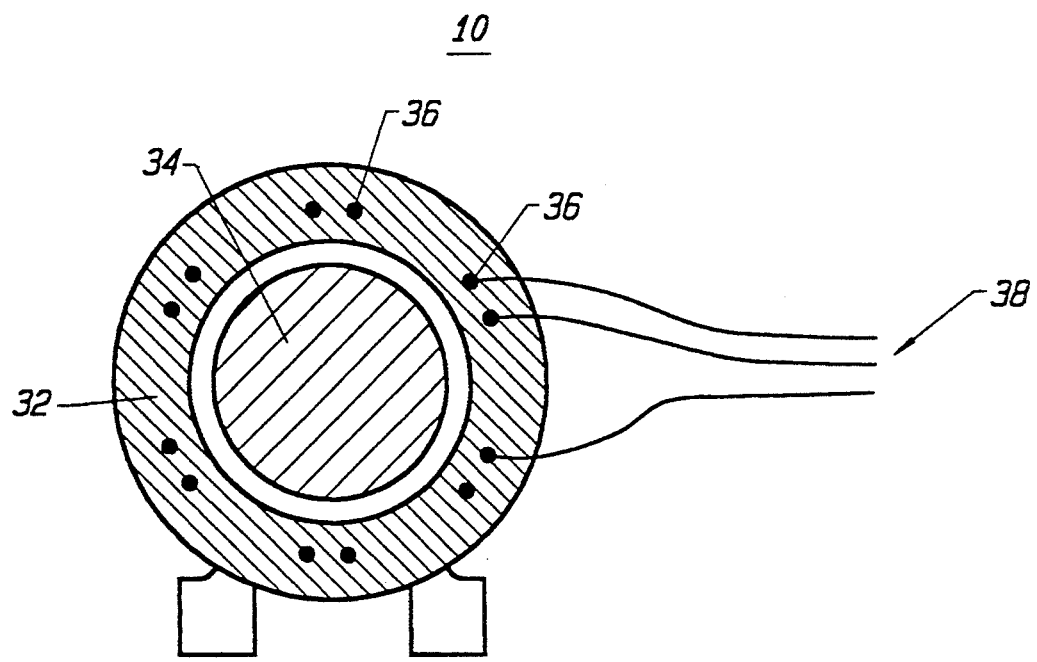
Figure 4:
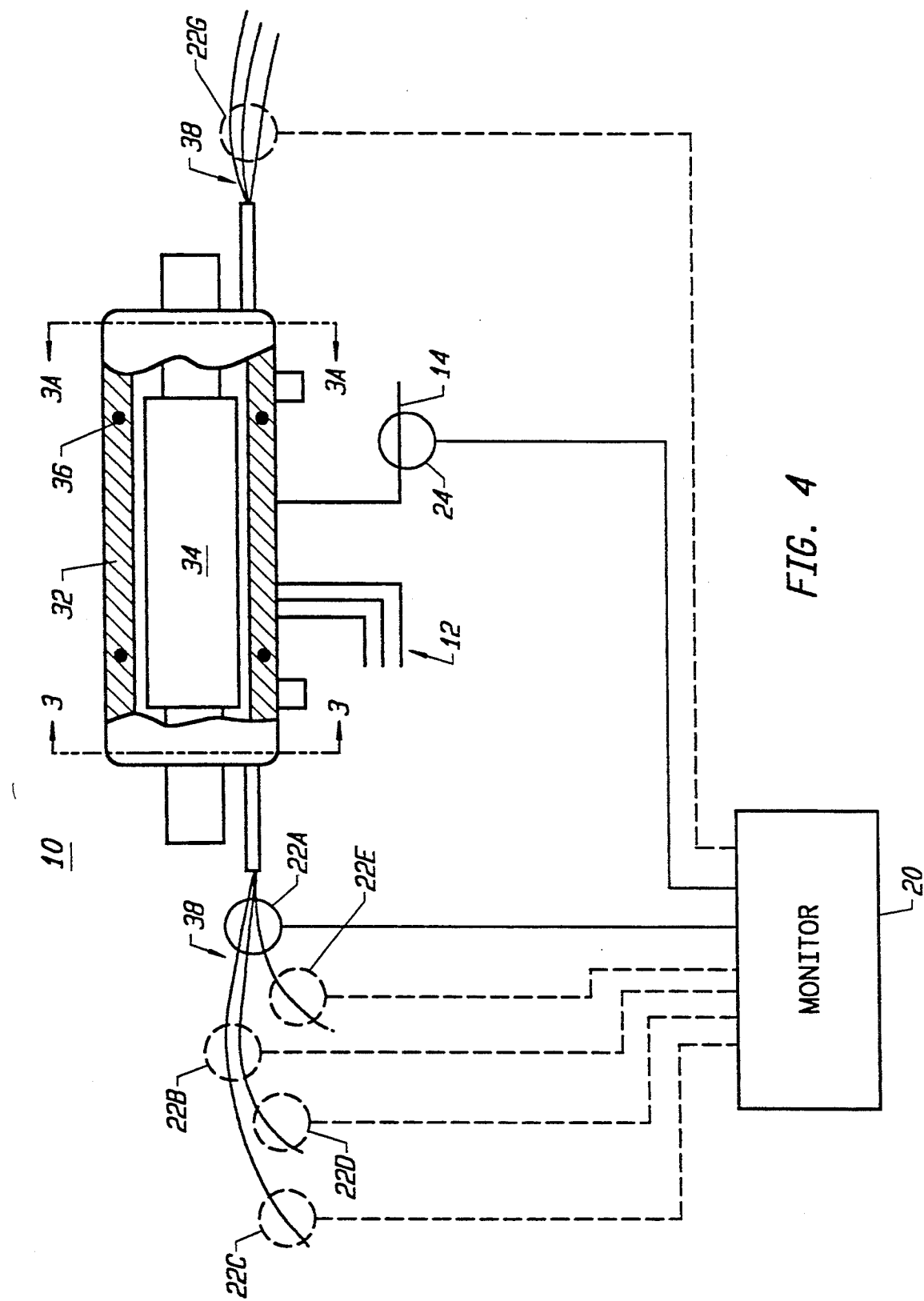
FIG. 4 is a block diagram showing the present invention as it is used with the generator illustrated in FIG. 2.

FIG. 4 illustrates the present invention and its use. The present invention has RF monitor 20 and coupling device 22 which provides a connection between sensor leads 38 and RF monitor 20. Coupling device 22 is illustrated in several representative positions, that is, in positions 22A as well as in positions 22B-22G shown in phantom. RF monitor 20 is used to monitor sensor leads 38 to measure RF emissions flowing in sensor leads 38. Coupling device 24, which may be omitted in the present invention, provides a connection between neutral ground lead 14 and RF monitor 20. RF monitor 20 preferably has a plurality of input channels to permit simultaneous monitoring of a plurality of coupling devices 22 and/or 24 thereby allowing time coincident comparison of RF emissions monitored on different sensor leads 38 and on neutral ground lead 14.

The present invention is flexible in implementation because a single coupling device 22 may be used to monitor sensor leads 38 both individually and as a group. Coupling device 22 in position 22A permits simultaneous monitoring of three sensor leads 38. Coupling device 22 may be similarly used to monitor all sensor leads 38 if desired. Thus the sensor leads 38 that are monitored by positions 22A and 22G may be configured for simultaneous monitoring by a single coupling device 22.

When RF monitor 20 detects an RF emission of interest flowing on sensor leads 38, maintenance personnel use the present invention to select one or more individual sensor leads 38 which will be of interest. An "RF emission of interest" will typically be a step change in RF emission activity. A sensor lead 38 is "of interest" when its associated thermal sensor 36 is likely to be close to the source of an RF emission. Proximity of a thermal sensor 36 to a source of an RF emission is indicated by the strength of RF emissions flowing within its associated sensor lead 38. Maintenance personnel select sensor leads 38 to be of interest by comparing RF emissions between individual sensor leads 38.

Since RF emission strength is known to be greater as distance from an RF emission source decreases, the location of RF emission sources is predicted using the present invention by comparing RF emissions flowing in different sensor leads 38. Similarly, maintenance personnel may also compare RF emissions in sensor leads 38 with RF emissions in neutral ground lead 14. Comparison of RF emissions in sensor leads 38 with RF emissions in neutral ground lead 14 provides a means of identifying certain immediately external generator sources (such as shaft grounding brush or rotor winding short test brush arcing) that are known to occur at both measuring sites.

After maintenance personnel have selected a single sensor lead 38 or a group of sensor leads 38 to be of interest, that is, to be probably close to the RF emission source, then maintenance personnel use a means to physically locate the thermal sensor(s) 36 in stator 32 which is matched with the sensor lead(s) 38 which are of interest. There are several means potentially available for physically locating the thermal sensor 36 or thermal sensors 36 which are of interest. These means include drawings, routing documentation, location tags placed on sensor leads 38, color coding, and tracing sensor leads 38 through their routes. In repairing generator 10, maintenance personnel may focus their attention on locations in generator 10 near thermal sensors 36 that have been selected to be of interest.

The location that is selected to be of interest may also be evaluated with a temperature and vibration reading at the location to further confirm the existence of a problem at the particular location. For example, high levels of RF emissions, elevated temperatures, and elevated vibration levels at the same site would be confirmatory of a problem at the particular location.

An example of a method of using the present invention to select sensor leads 38 which are of interest is now provided. A single coupling device 22 at position 22A is first used to simultaneously monitor several sensor leads 38. When an RF emission of interest is detected, such an RF emission will have been flowing in any one or more of the several sensor leads 38. To identify the particular sensor lead(s) 38 of interest, coupling device 22 is then physically moved to position 22B to monitor fewer sensor leads 38. In the position 22B case, two sensor leads 38 are monitored. If the RF emission of interest continues to be detected on RF monitor 20, then one of the two monitored sensor leads 38 is near the RF emission source. Accordingly, coupling device 22 is moved to positions 22C and 22D to permit comparison of RF emissions flowing on each of the two sensor leads 38 that are monitored by position 22B. If at position 22B, no or low RF emissions are detected then coupling device 22 is moved to position 22E to monitor the sensor lead 38 that was excluded from monitoring at the 22B position.

Other examples of methods of using the present invention to select sensor leads 38 of interest may be provided. For example, maintenance personnel may monitor the neutral ground lead 14 using coupling device 24. Since the neutral ground lead 14 receives RF emissions originating from throughout generator 10 (as well as originating from external sources, unfortunately), an RF emission of interest will appear on the neutral ground lead 14. When such an emission appears, the method of sensor lead 38 selection of the previous paragraph may then be employed. Alternatively, maintenance personnel may then monitor individual sensor leads 38 sequentially. Thus monitoring at positions 22A and 22B may be omitted and positions 22C, 22D, and 22E may be sequentially monitored.

The method of selecting sensor leads 38 of interest may be accomplished by physically moving coupling device 22 between individual and groups of sensor leads 38 as described above. Using that method, a split core current transformer used as a coupling device 22 permits convenient movement of coupling device 22 between sensor leads 38. Alternatively, separate coupling devices 22 may be respectively provided for each different sensor lead 38. A still further method of selecting sensor leads 38 of interest is to use a single coupling device 22 to monitor a plurality of sensor leads 38 but, instead of physically moving the coupling device 22, using a switching system of the present invention. This switching system is used to selectively activate and deactivate individual sensor leads 38 for RF monitoring. This switching system is described in further detail in the following paragraphs.

Figure 5:
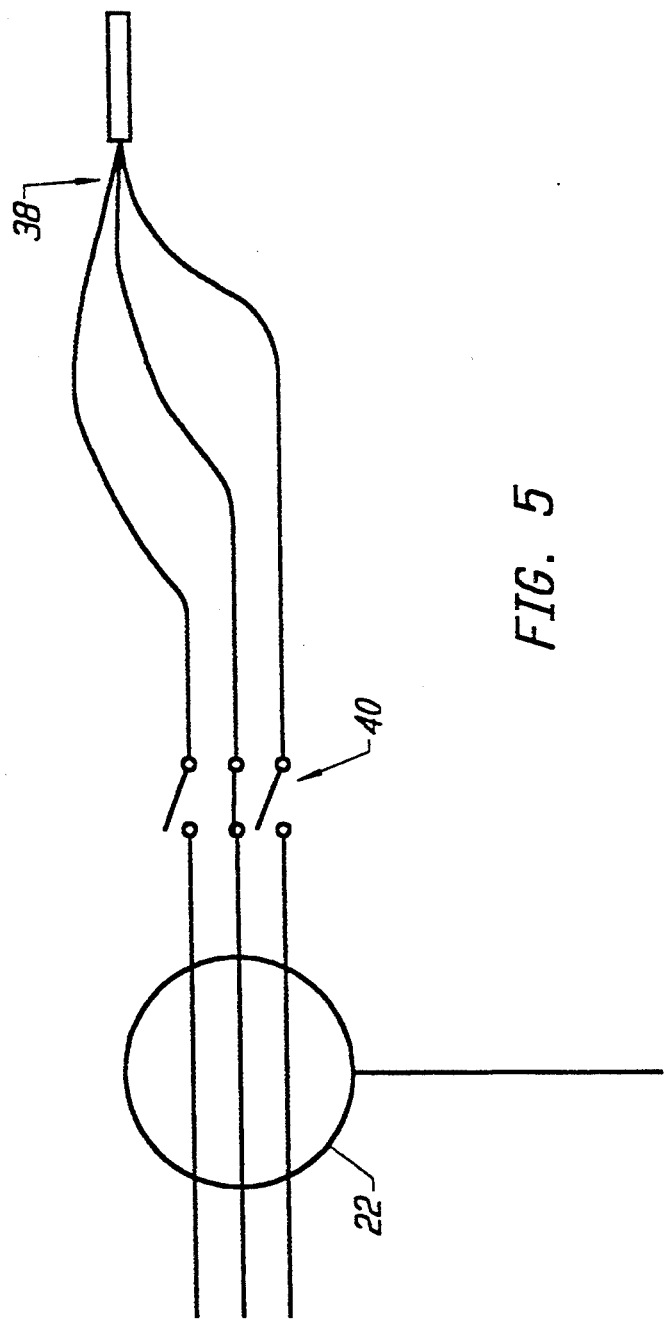
FIG. 5 is a block diagram showing a switch system of the present invention which permits a single coupling device to selectively monitor several sensor leads simultaneously or to selectively monitor individual sensor leads to the exclusion of other sensor leads.

FIG. 5 illustrates a switching system of the present invention comprising switches 40 which permit a single coupling device 22 to monitor a plurality of sensor leads 38 both individually and collectively without a need to physically move coupling device 22 from one sensor lead 38 to another sensor lead 38. Each switch 40 is in series connection with its respective sensor lead 38. Switches 40 are normally closed to permit continuous thermal monitoring of generator 10. When an RF signal of interest is detected, switches 40 are selectively opened and closed to permit monitoring of different sensor leads 38 while isolating other sensor leads 38.

With all switches 40 in closed position, monitoring position 22A in FIG. 4 is duplicated. A single closed switch 40, with other switches 40 open, corresponds to position 22C, 22D, or 22E, depending upon which sensor lead 38 has its switch 40 in the closed position.

Figure 6:
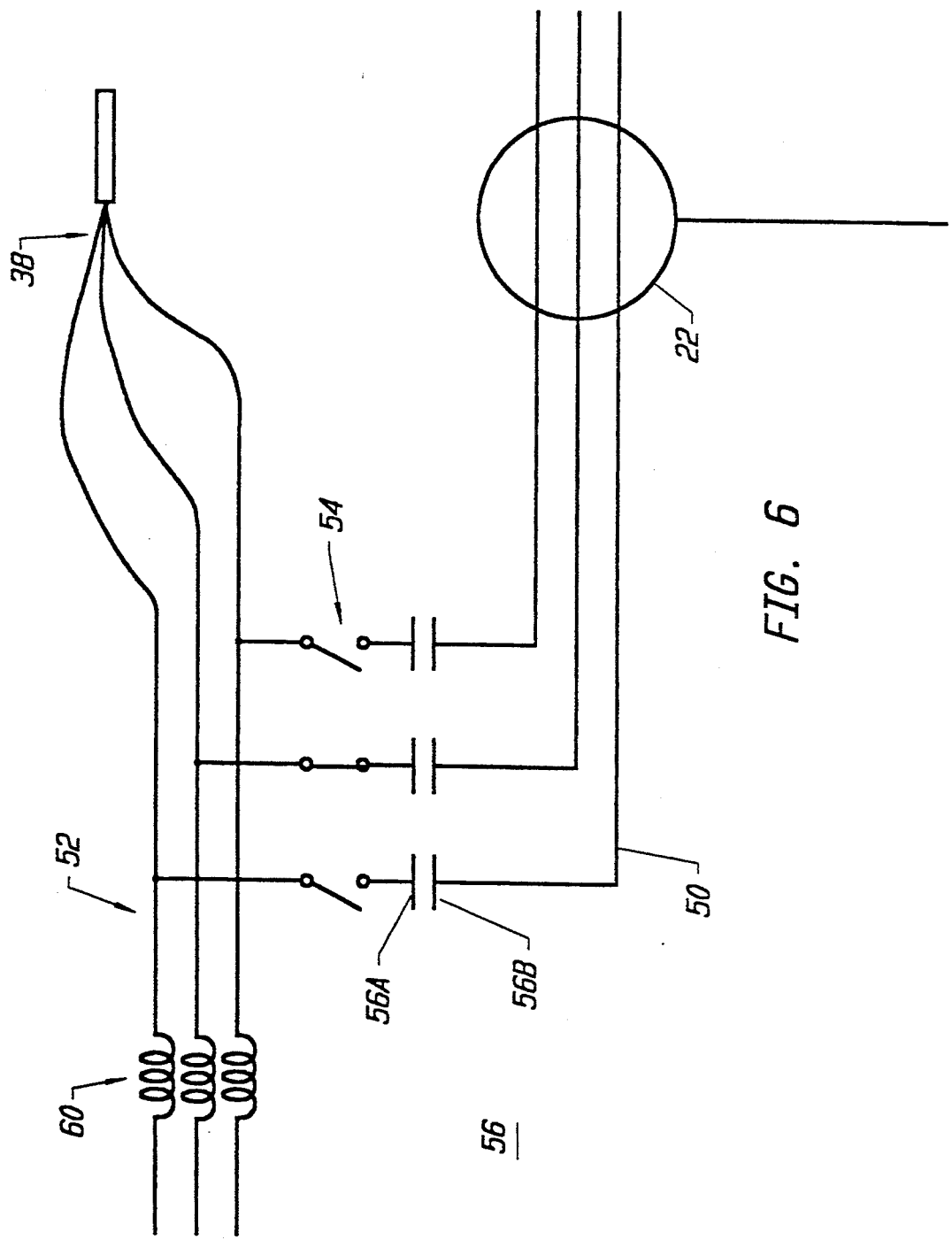
FIG. 6 is a block diagram showing a capacitive shunt system of the present invention which permits isolation of a coupling device from the direct current circuit of sensor leads.

FIG. 6 illustrates a capacitive shunt system of the present invention which permits isolation of coupling device 22 from the direct current circuit of sensor leads 38. Each sensor lead 38 has a capacitive shunt 50 by which connections between RF monitor 20 and sensor leads 38 are made. Each capacitive shunt 50 comprises a connection 52 to sensor lead 38, a switch 54, a capacitor 56, and coupling device 22. Capacitor 56 has two plates, first plate 56A and second plate 56B. Each switch 54 provides a switch able connection between its sensor lead 38 and a respective first plate 56A of capacitor 50. RF monitor 20 has a connection to second plate 56B of capacitor 50. The connection between RF monitor 20 and second plate 56B is an inductive connection by means of a current transformer having its core disposed around a lead having one end making a connection to second plate 56B and having a second end grounded on generator 10. Alternatively, the connection between RF monitor 20 and second plate 56B may be by means of a hard wire connection directly from RF monitor 20 to second plate 56B.

RF emissions pass through capacitors 56 while capacitors 56 isolate the direct current circuits of sensor leads 38 from RF monitor 20. The FIG. 6 configuration has an advantage over the FIG. 5 configuration because the FIG. 6 configuration permits selective monitoring of a plurality of sensor leads 38 and monitoring individual sensor leads 38 without interrupting continuous temperature monitoring of generator 10.

Inductors 60, which are RF chokes, are disposed in series on respective sensor leads 38. Inductors 60 reduce RF emissions having sources external to generator 10 from flowing from temperature monitoring equipment to connection 52. The direct current operation of sensor leads 38 is not impaired by inductors 60 since inductors 60 are low-pass devices.

The present inventors have tested the concept of the present invention in two turbine generators. These tests have found that there is a wide distribution of RF emissions observed on various sensor leads 38. Some sensor leads 38 show no RF emissions at a given time while other sensor leads 38 show considerable RF emission activity at that same time.

Observed coincidence of RF emission pulses at neutral ground lead 14 and an individual sensor lead 38 indicates that the same sources of RF emissions were detected by RF monitor 20. In most cases, pulses that were observed to be relatively low in amplitude on one side of generator 10 were relatively high in amplitude on the other side of generator 10. The present inventors have observed there to be a high degree of selectivity in the sensor leads 38 in picking up and transmitting the pulses within generator 10.

FIG. 7 is a graphical representation of monitored RF activity on the neutral lead of a working generator as well as a representation of time coincident RF activity on a resistance temperature detector sensor lead of the same generator. The working generator that was monitored to produce FIG. 7 was the Manatee 2 unit located at Parrish, Fla. and operated by Florida Power and Light, an electric power utility company. FIG. 7 shows that a burst of RF is seen on both the neutral lead and on a resistance temperature detector. This indicates that the same RF emission may be detected on both the neutral lead and a resistance temperature detector. In addition, FIG. 7 shows two spikes on a resistance temperature detector which are not seen on the neutral lead.

FIG. 8 is a graphical representation of monitored RF activity on a resistance temperature detector sensor lead of a working generator. The working generator that was monitored to produce FIG. 8 was the Manatee 2 unit located at Parrish, Fla. and operated by Florida Power and Light.

Figure 9:
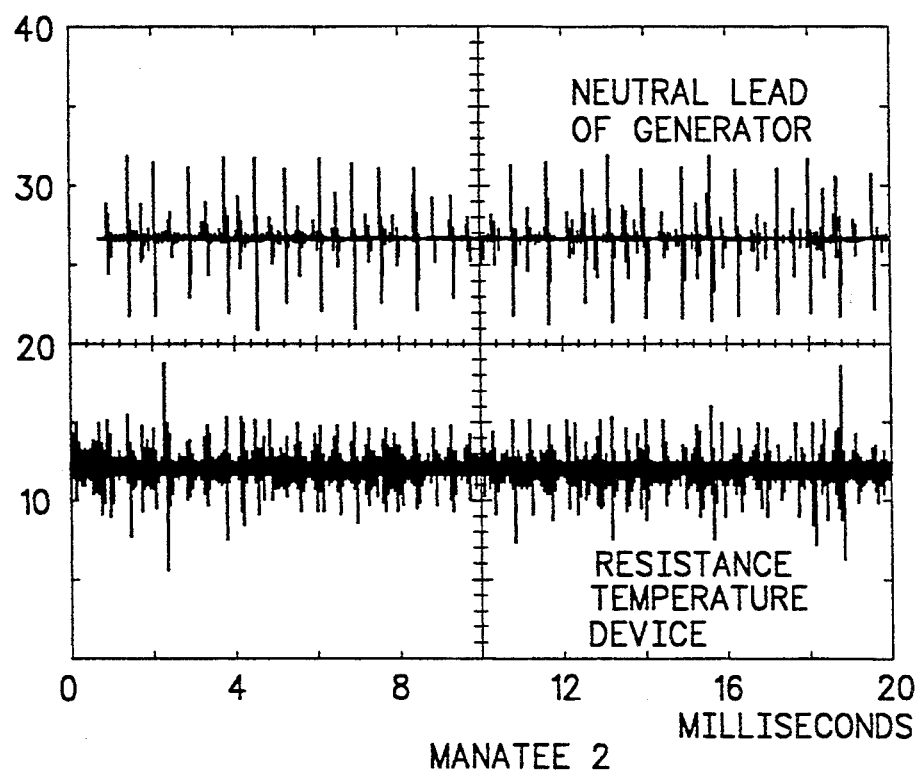
FIG. 9 is a graphical representation of tested RF activity on the neutral lead of a working generator as well as a representation of time coincident RF activity on a resistance temperature detector sensor lead of the same generator.

FIG. 9 is a graphical representation of monitored RF activity on the neutral lead of a working generator as well as a representation of time coincident RF activity on a resistance temperature detector sensor lead of the same generator. The working generator that was monitored to produce FIG. 9 was the Manatee 2 unit located at Parrish, Fla. and operated by Florida Power and Light. FIG. 9 shows that the neutral lead shows a very different RF spike activity from a resistance temperature detector. This different activity shows that different events are being detected.

Figure 10:
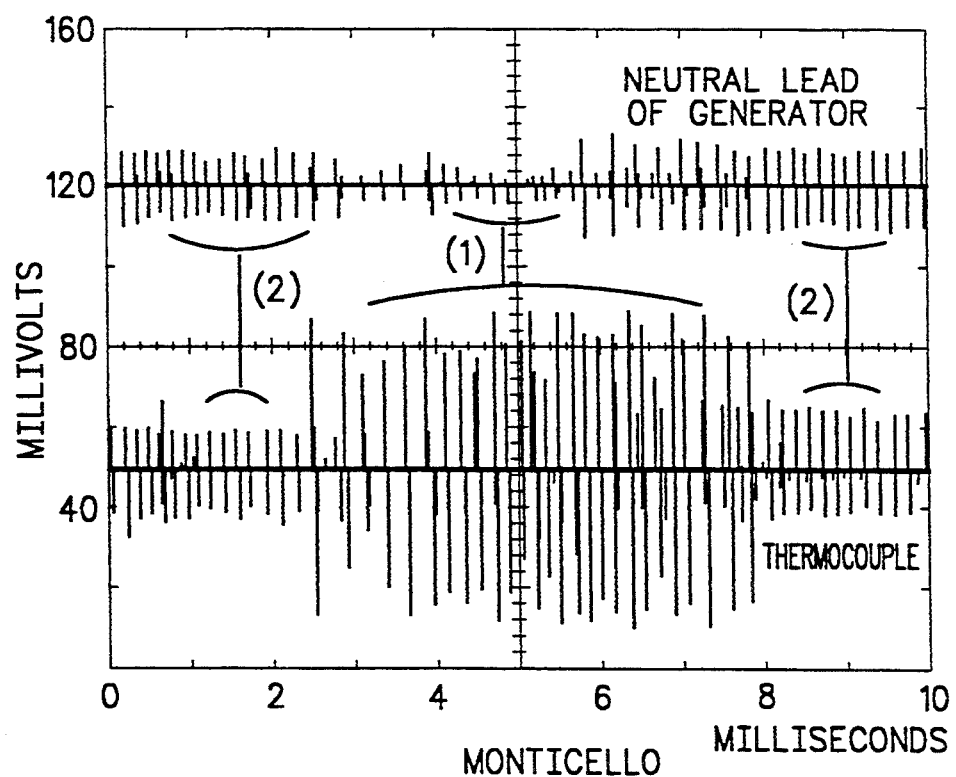
FIG. 10 is a graphical representation of tested RF activity on the neutral lead of a working generator as well as a representation of time coincident RF activity on a thermocouple sensor lead of the same generator.

FIG. 10 is a graphical representation of monitored RF activity on the neutral lead of a working generator as well as a representation of time coincident RF activity on a thermocouple sensor lead of the same generator. The working generator that was monitored to produce FIG. 10 was the Monticello unit located at Mount Pleasant, Texas and operated by TU Electric, an electric power utility company. FIG. 10 is an expanded time view of two different signals (1) and (2) seen on the neutral lead and a thermocouple lead. A reverse amplitude ratio for the two signals is evident. (What does the reverse amplitude ratio indicate?)

Figure 11:
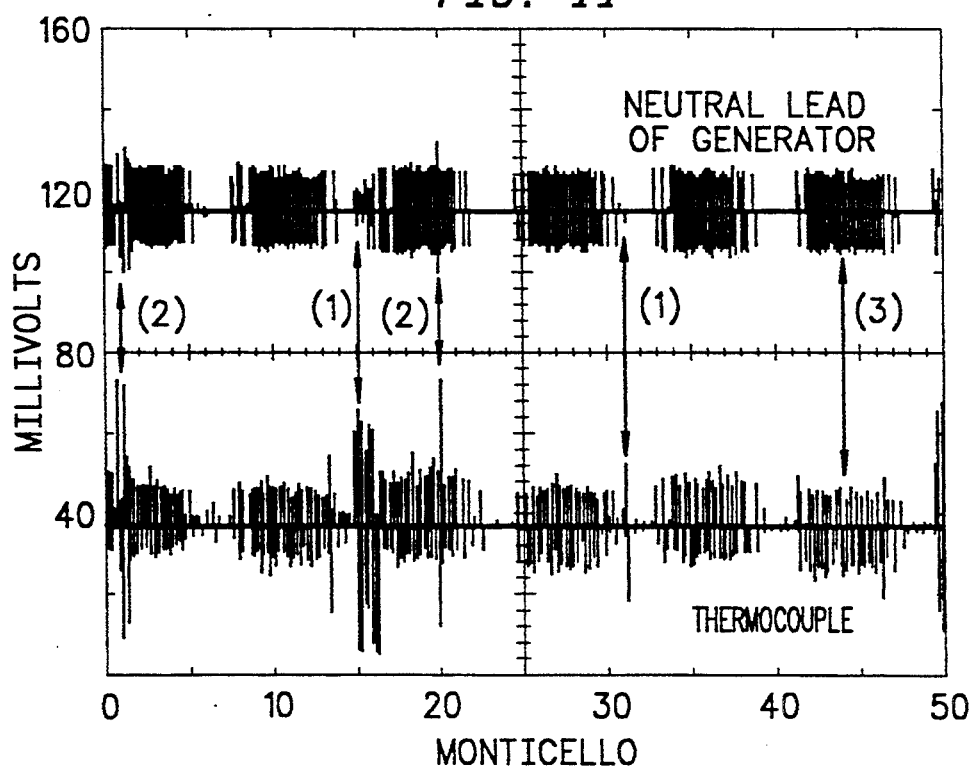
FIG. 11 is a graphical representation of tested RF activity on the neutral lead of a working generator as well as a representation of time coincident RF activity on a thermocouple sensor lead of the same generator.

FIG. 11 is a graphical representation of monitored RF activity on the neutral lead of a working generator as well as a representation of time coincident RF activity on a thermocouple sensor lead of the same generator. The working generator that was monitored to produce FIG. 11 was the Monticello unit located at Mount Pleasant, Tex. and operated by TU Electric. FIG. 11 shows three different signals (1), (2), and (3) which are seen on both the neutral lead and the thermocouple lead but with quite different amplitude ratios. This indicates a very different ability of the two leads to detect the three different events (1), (2), and (3).

Figure 12:
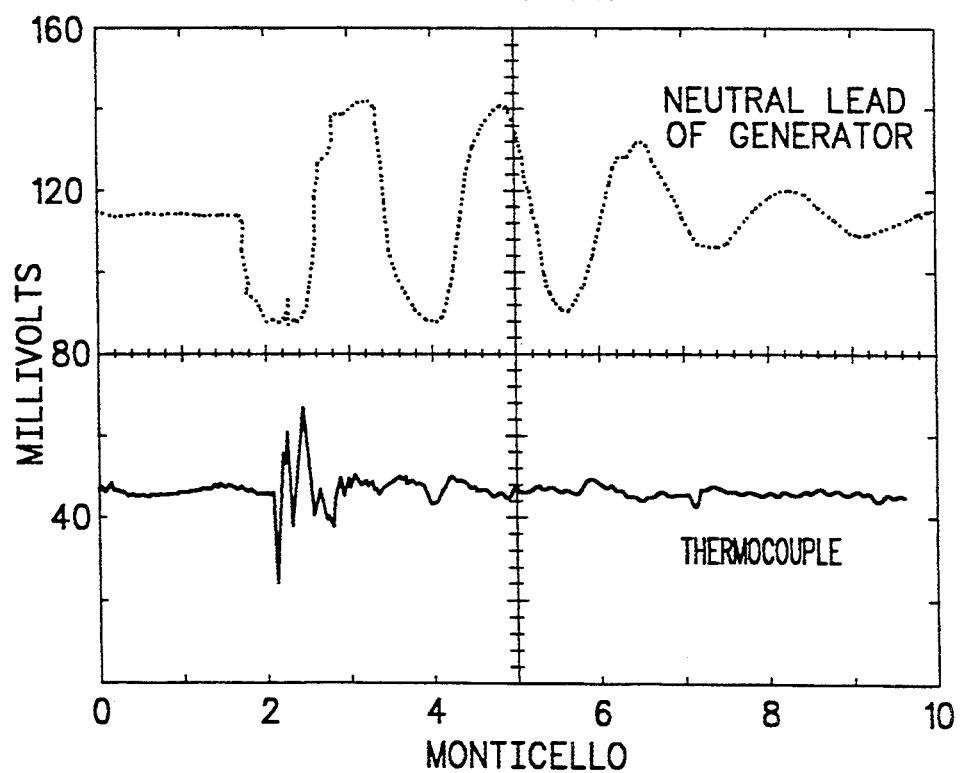
FIG. 12 is a graphical representation of tested RF activity on the neutral lead of a working generator as well as a representation of time coincident RF activity on a thermocouple sensor lead of the same generator.

FIG. 12 is a graphical representation of monitored RF activity on the neutral lead of a working generator as well as a representation of time coincident RF activity on a thermocouple sensor lead of the same generator. The working generator that was monitored to produce FIG. 12 was the Monticello unit located at Mount Pleasant, Tex. and operated by TU Electric. FIG. 12 provides a greatly expanded (what scale?) time view of a single pulse as seen on both the neutral lead and a thermocouple lead. The lower ringing frequency of the neutral lead reflects the different electrical character of the two leads.

Persons skilled in the art of the present invention may, upon exposure to the teachings herein, conceive other variations. Such variations are deemed to be encompassed by the disclosure, the invention being limited only by the appended claims.

We claim:

1. An apparatus for identification and location of internal arcing in a dynamoelectric machine, said apparatus comprising;.

a. a dynamoelectric machine having a thermal sensor installed within said dynamoelectric machine, wherein said thermal sensor has a thermal sensor lead connected to a thermal monitor b. an RF (radio frequency) monitor, c. an RF sensor lead connection between said RF monitor and said thermal sensor lead, such that said RF sensor lead connection couples RF emissions which originate from within said dynamoelectric machine as a result of internal arcing and flow on said thermal sensor lead to said RF sensor lead and then to said RF monitor.

2. The apparatus of claim 1 wherein said RF sensor lead connection further comprises a capacitor having first and second capacitor plates, a connection between said first capacitor plate and said thermal sensor lead, and a connection between said RF monitor and said second capacitor plate.

3. The apparatus of claim 2 wherein said connection between said RF monitor and said second capacitor plate further comprises a lead connected to said second capacitor plate and a current transformer having a core disposed around said lead connected to said second capacitor plate.

4. The apparatus of claim 1 wherein said RF sensor lead connection comprises a current transformer having a core disposed around said thermal sensor lead.

5. The apparatus of claim 1, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

6. The apparatus of claim 2, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

7. The apparatus of claim 3, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

8. The apparatus of claim 4, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

9. An apparatus for identification and location of internal arcing in a dynamoelectric machine, the apparatus comprising:

a. a dynamoelectric machine having a neutral ground lead and having a thermal sensor installed within said dynamoelectric machine, wherein said thermal sensor has a thermal sensor lead connected to a thermal monitor b. an RF (radio frequency) monitor, c. an RF sensor lead connection between said RF monitor and said thermal sensor lead, d. a neutral ground lead connection between said RF monitor and said neutral ground lead, such that said RF sensor lead connection and said neutral ground lead connection couple said RF emissions which originate from within said dynamoelectric machine as a result of internal arcing and flow on said thermal sensor lead and on said neutral ground lead to said RF monitor.

10. The apparatus of claim 9 wherein said RF sensor lead connection further comprises a capacitor having first and second capacitor plates, a connection between said first capacitor plate and said thermal sensor lead, and a connection between said RF monitor and said second capacitor plate.

11. The apparatus of claim 10 wherein said connection between said RF monitor and said second capacitor plate further comprises a lead connected to said second capacitor plate and a current transformer having a core disposed around said lead connected to said second capacitor plate.

12. The apparatus of claim 9 wherein said RF sensor lead connection comprises a current transformer having a core disposed around said thermal sensor lead.

13. The apparatus of claim 9, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

14. The apparatus of claim 10, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

15. The apparatus of claim 11, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

16. The apparatus of claim 12, further comprising an inductor disposed in series on said thermal sensor lead and wherein said RF sensor lead connection is located on said thermal sensor lead between said thermal sensor and said inductor such that RF emissions not originating from said dynamoelectric machine are prevented from passing through said inductor to said RF sensor lead connection.

17. A method for locating sources of arcing within a dynamoelectric machine having a neutral ground lead and having a first thermal sensor and a second thermal sensor installed at locations within said machine, wherein said first and second thermal sensors have respective first and second thermal sensor leads leading to a thermal monitor, comprising the steps of:

a. using an RF monitor for monitoring said first sensor lead to measure first RF emissions flowing in said first thermal sensor lead;

b. using an RF monitor for monitoring said second thermal sensor lead to measure second RF emissions flowing in said second thermal sensor lead;

c. comparing the strength of said first RF emissions with the strength of said second RF emissions;

d. selecting from said first sensor thermal lead and from second thermal sensor lead a sensor lead of interest based upon strength of RF emissions;

e. using means to locate within said machine a thermal sensor attached to said thermal sensor lead of interest.

18. The method of claim 17 further comprising the steps of:

a. using an RF monitor for monitoring said neutral ground lead to measure third RF emissions flowing in said neutral ground lead;

b. comparing said first RF emissions to said third RF emissions to identify external generator RF emission sources;

c. comparing said second RF emissions to said third RF emissions to identify external generator RF emission sources.

* * * * *